(12) United States Patent
Mandell et al.

(10) Patent No.: US 6,757,884 B2
(45) Date of Patent: Jun. 29, 2004

(54) APPLICATION SPECIFIC INTEGRATED CIRCUIT DESIGN TOOL AND FILE STRUCTURE

(75) Inventors: Michael I. Mandell, Los Angeles, CA (US); Arnold L. Berman, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 111 days.

(21) Appl. No.: 09/918,596

(22) Filed: Jul. 31, 2001

(65) Prior Publication Data

US 2003/0074640 A1 Apr. 17, 2003

(51) Int. Cl.[7] ............................................. G06F 17/50
(52) U.S. Cl. ....................................................... 716/18
(58) Field of Search .................................... 716/1, 2, 4, 5, 716/17, 18; 717/158

(56) References Cited

U.S. PATENT DOCUMENTS

| | | | |
|---|---|---|---|
| 5,764,525 A | * 6/1998 | Mahmood et al. | ............ 716/18 |
| 6,077,303 A | 6/2000 | Mandell et al. | ............... 703/14 |
| 6,275,981 B1 | * 8/2001 | Buzbee et al. | .............. 717/158 |
| 6,477,683 B1 | * 11/2002 | Killian et al. | .................. 716/1 |

* cited by examiner

Primary Examiner—Matthew Smith
Assistant Examiner—Thuan Do
(74) Attorney, Agent, or Firm—Harness Dickey & Pierce P.L.C.

(57) ABSTRACT

A design tool and method for characterizing a circuit at a hardware level includes the steps of generating a behavioral level description of the circuit and generating a netlist from the behavioral level description. Reference equations are generated from the netlist and are translated into numeric and symbolic C-code. The symbolic C-code is compared to the numeric C-code for validation. The reference equations are translated into numeric and symbolic HDL-code. The symbolic HDL-code is compared to the numeric HDL-code for validation. The symbolic C-code is compiled and simulated. A C-code equation file is generated. The symbolic HDL-code is compiled and simulated. A HDL-code equation file is generated. A symbolic manipulation program is used to solve for a difference between the C-code equation file and the HDL-code equation file. If there are no unexpected differences, equivalence is established.

21 Claims, 7 Drawing Sheets

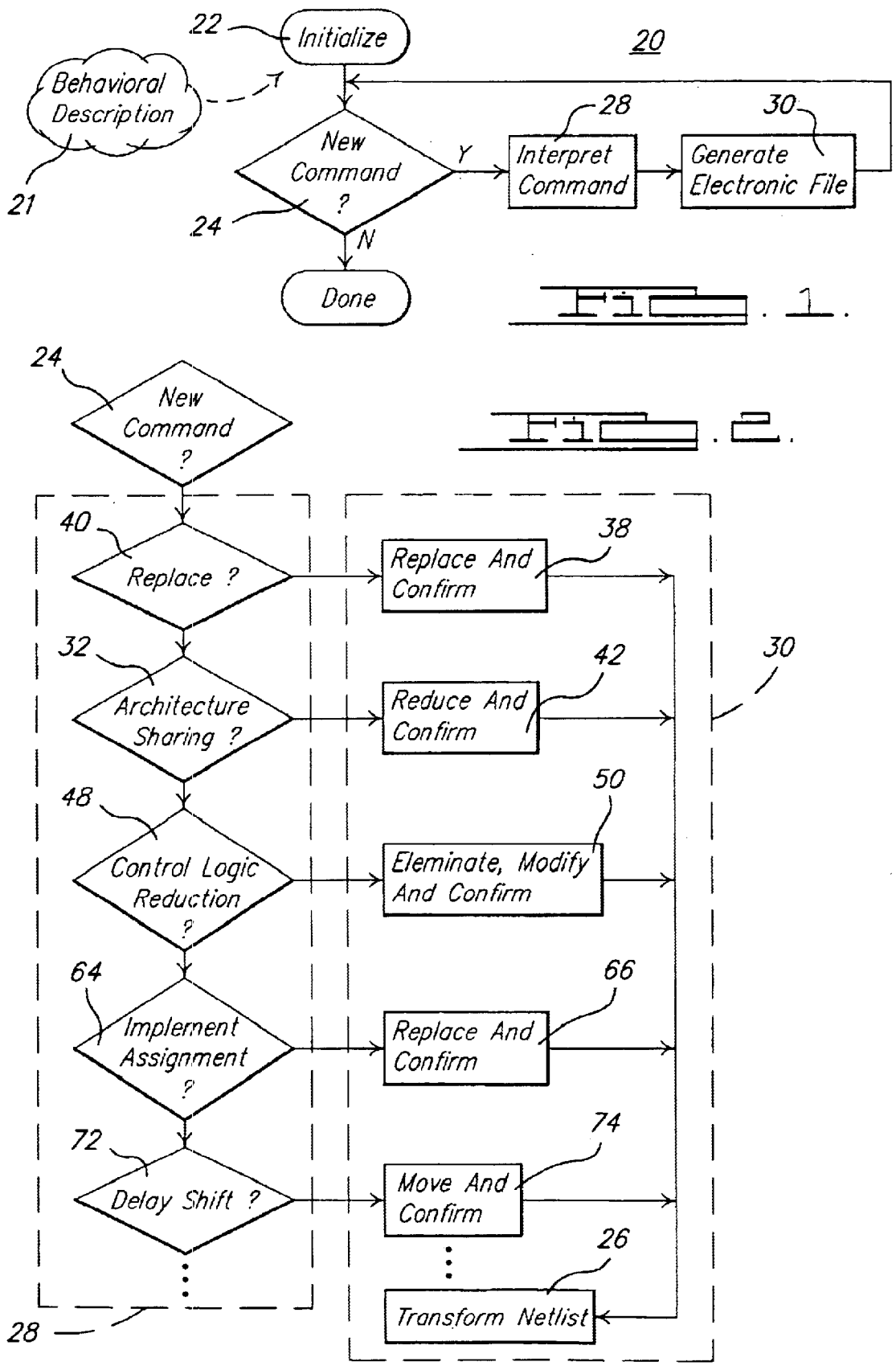

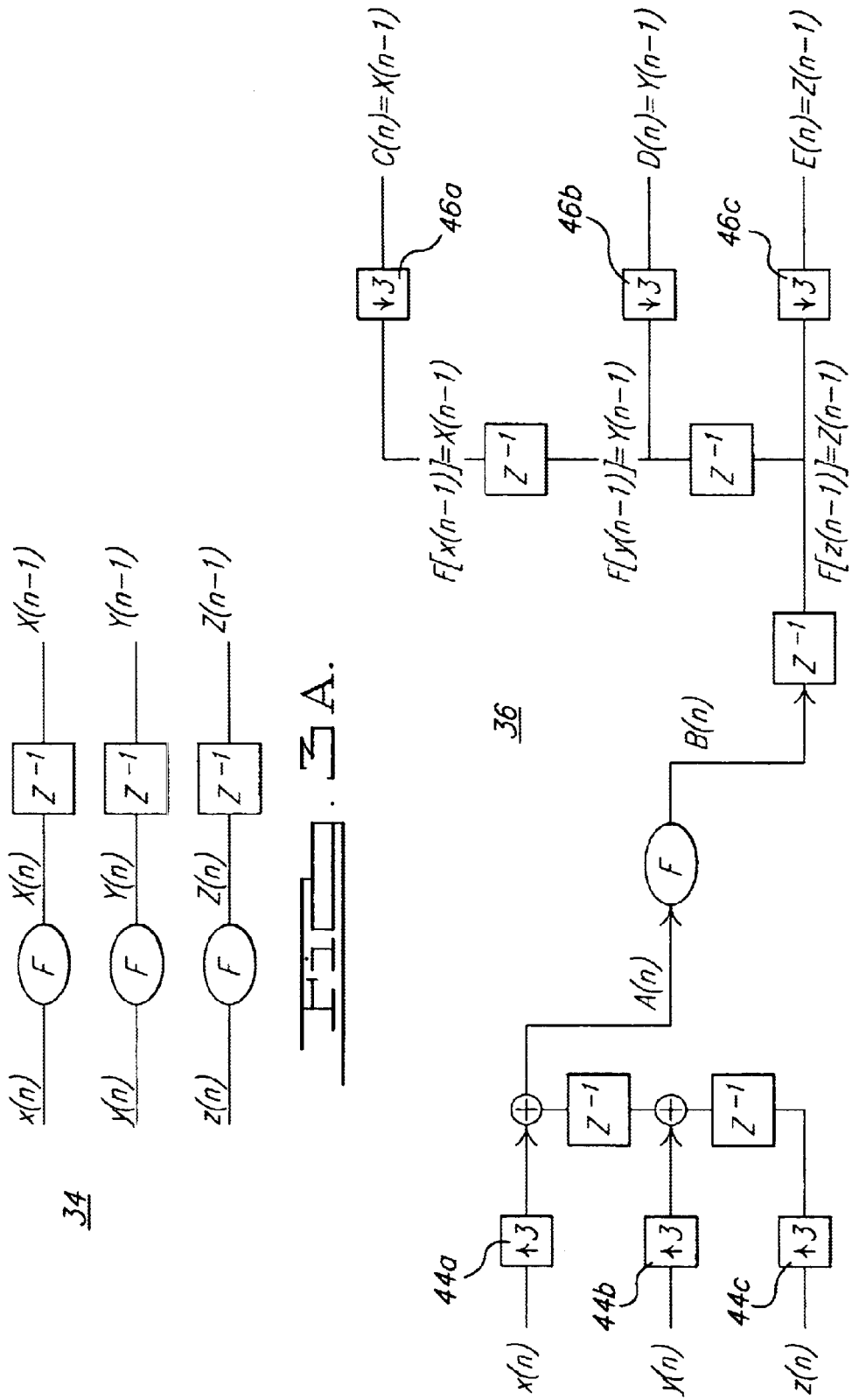

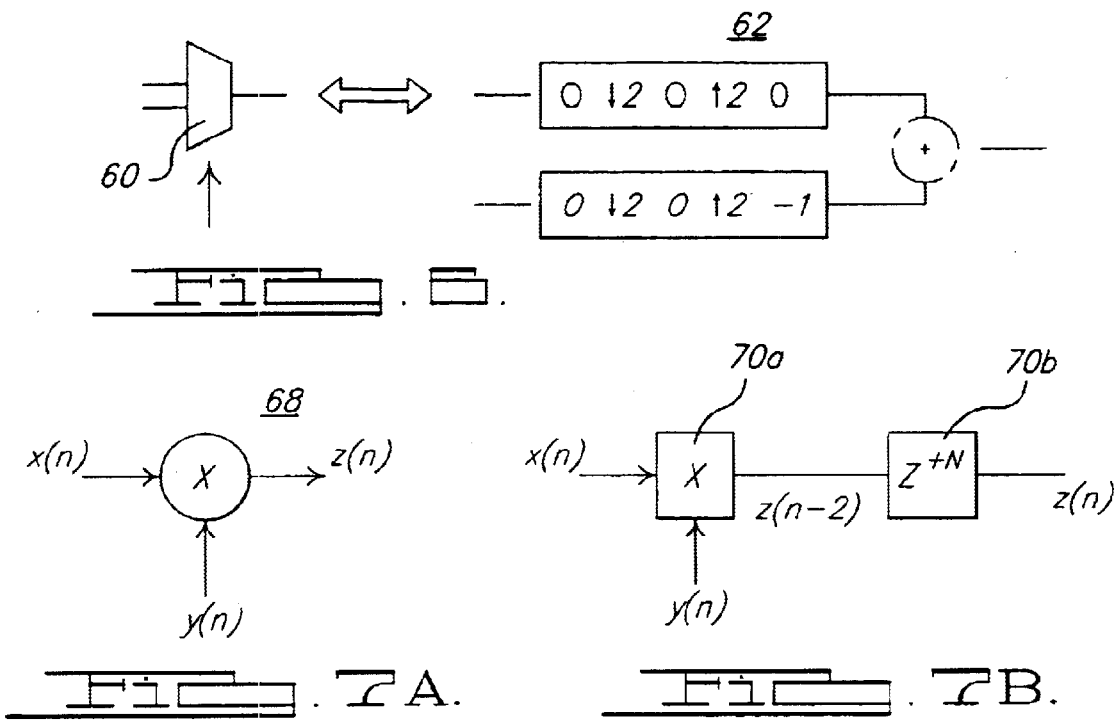
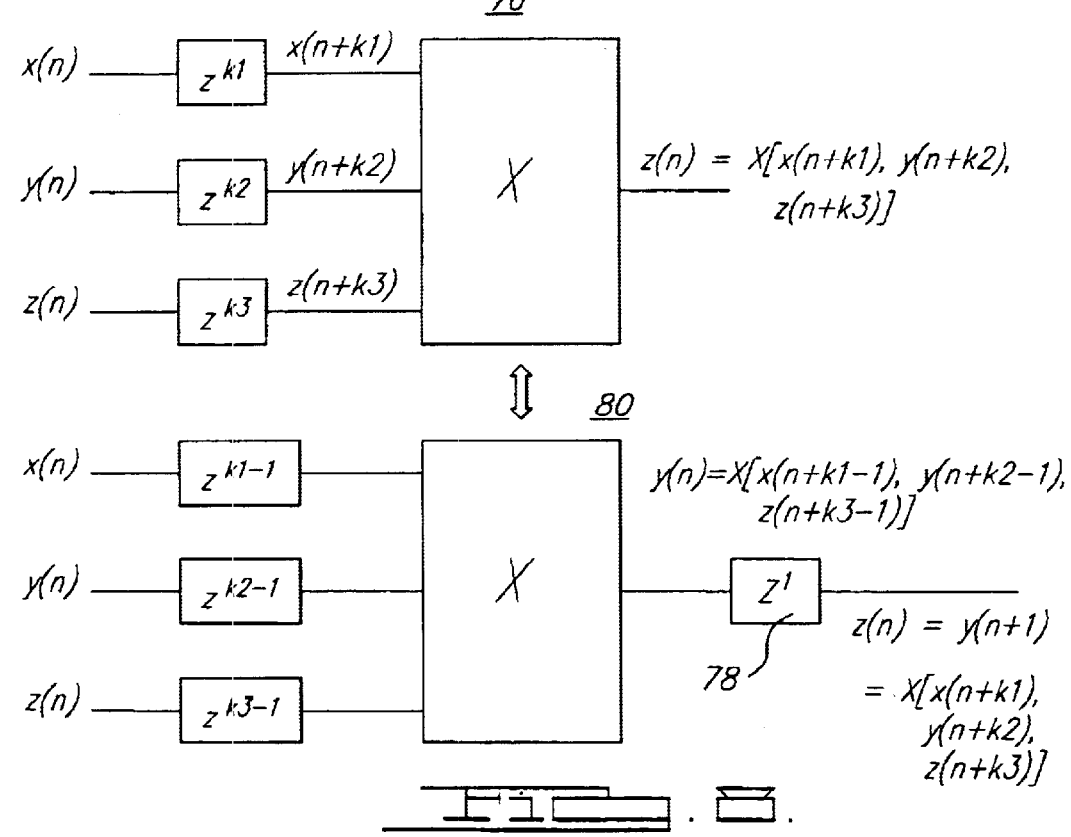

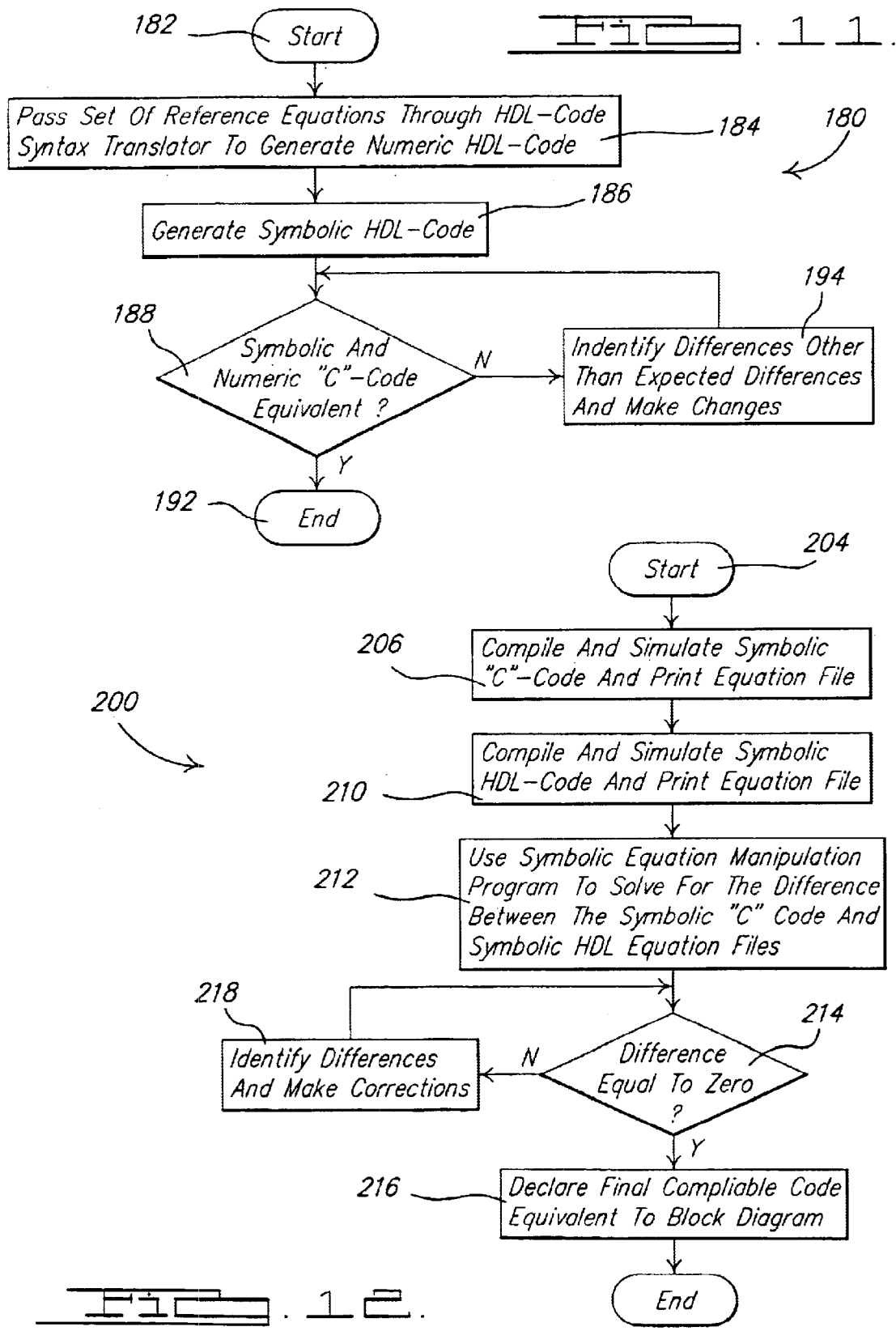

APPLICATION SPECIFIC INTEGRATED CIRCUIT DESIGN TOOL AND FILE STRUCTURE

TECHNICAL FIELD

This invention relates to electronic circuits and, more particularly the design and validation of electronic circuits.

BACKGROUND OF THE INVENTION

In order to fabricate an electronic circuit such as an application specific integrated circuit (ASIC) or a field programmable gate array (FPGA), a number of steps must be performed. The first step is to design the circuit at a "behavioral" level. The behavioral level is the top level of the design hierarchy. Additional steps are performed on the behavioral level to define a hardware level that characterizes the circuit using actual hardware components. The hardware level is the lowest level of the design hierarchy.

The behavioral level description typically includes a block diagram or netlist that describes the various functions of the circuit in relatively general terms. The hardware level is based on the behavioral level description. The behavioral level description does not have enough specificity to fully enable a circuit manufacturer to implement the circuit design. The conventional approach is to manually generate an electronic file that characterizes the circuit at the hardware level in a programming language such as hardware description language (HDL). A design engineer goes through the behavioral description on a component-by-component basis and generates the necessary code sets in the programming language. This approach is labor intensive and subject to human error.

Once the electronic file has been manually generated, a complex verification process is required. In the case of the ASIC design, the functionality is extensively verified from a model of the circuit written in C-code. A select set of C-code input simulation vectors (i.e. input sequences) are then also applied to the HDL circuit model. In this co-simulation, the output vectors from the HDL model are compared bit by bit to the corresponding output vectors from the C-code model to establish a correspondence between the performance verified by the C-code model and the hardware actually being fabricated. This is typically required due to the complexity of the ASIC chip and the difficulty in performing a functional simulation in HDL, the complexity and cost of the ASIC fabrication process, and the need for a high level of certainty as to the functionality and first pass success of the electronic file and its subsequent fabrication.

The manual generation of the C-code model also requires detailed knowledge of C-code which increases the labor costs that are associated with design and fabrication. Once the electronic file has been verified, it is typically converted to the format used by the manufacturer with a conversion program such as Synopsis. After the electronic file has been converted, the manufacturer fabricates the circuit.

In U.S. Pat. No. 6,077,303 to Mandell et al. and U.S. Pat. No. 6,477,689 to Mandell et al., a design tool and method for simplifying the design of electronic circuits such as ASICs is disclosed. The design tool and method generates symbolic and numeric equations. In Mandell et al. '303, a method is disclosed for verifying that a system that is built from smaller components implements a desired equation that represents the system. Symbolic data is clocked through the system by processing a symbolic test vector using linked equations that are written for each component of the system. The resulting symbolic equation, generated at the output of the system, is stored. The symbolic equation is then compared with the desired equation for the system using a symbolic manipulation tool. If the comparison generates a zero difference, the system correctly implements the desired equation that correctly represents the system.

SUMMARY OF THE INVENTION

A design tool and method according to the invention for characterizing a circuit at a hardware level includes the steps of creating a behavioral level description of the circuit and generating a netlist from the behavioral level description. Reference equations are generated from the netlist. The reference equations are translated into numeric and symbolic C-code. The symbolic C-code is compared to the numeric C-code for validation.

In other features of the invention, the reference equations are translated into numeric and symbolic HDL-code. The symbolic HDL-code is compared to the numeric HDL-code for validation. The symbolic C-code is compiled and simulated. A C-code equation file is generated. The symbolic HDL-code is compiled and simulated. A HDL-code equation file is generated. A symbolic manipulation program is used to solve for a difference between the C-code equation file and the HDL-code equation file. If there are no unexpected differences, equivalence is established.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

BRIEF DESCRIPTION OF THE DRAWINGS

The present invention will become more fully understood from the detailed description and the accompanying drawings, wherein:

FIG. 1 is a flowchart of a computer-implemented method for characterizing a circuit at a hardware level;

FIG. 2 illustrates a method for implementing modifications with a set of predefined modules;

FIG. 3A is a block diagram of an original architecture of a circuit before application of an architecture sharing command;

FIG. 3B is a block diagram of a reduced architecture resulting after application of the architecture sharing command;

FIG. 6 is a block diagram showing a two-way multiplex control counter;

FIG. 7A is a block diagram of an original component before application of an implementation assignment command;

FIG. 7B is a block diagram illustrating implementation components after application of an implementation assignment command;

FIG. 8 is a block diagram illustrating delay shifting;

FIG. 11 illustrates steps for generating symbolic and numeric HDL-code; and

FIG. 12 illustrates steps for compiling and comparing the symbolic C-code and symbolic HDL-code to confirm the circuit design.

DETAILED DESCRIPTION OF THE PREFERRED EMBODIMENTS

Figure 4:
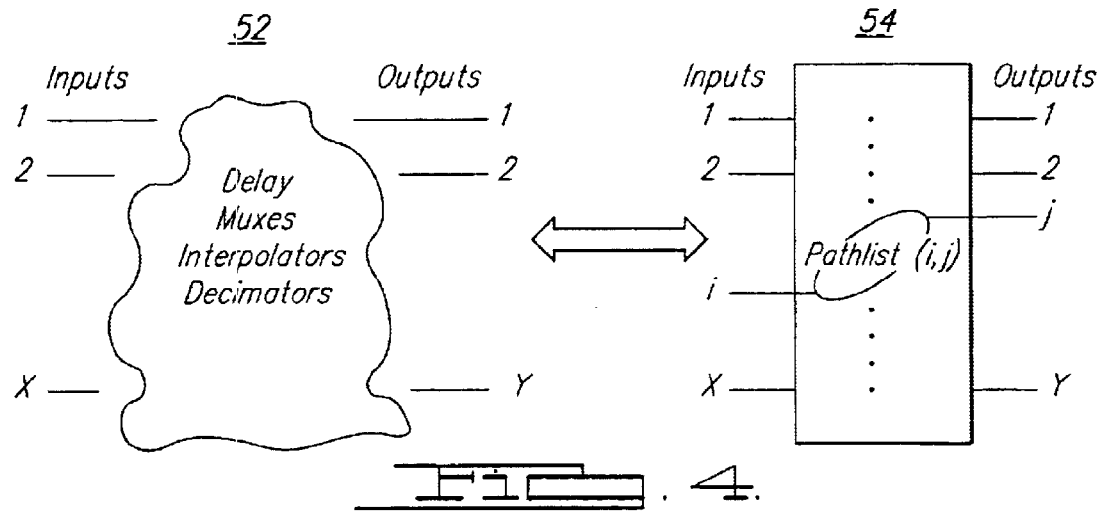
FIG. 4 is a block diagram illustrating the reduction of control logic.

The following description of the preferred embodiment(s) is merely exemplary in nature and is in no way intended to limit the invention, its application, or uses.

Turning now to FIG. 1, a computer-implemented design tool and method 20 for characterizing a circuit (not shown) at a hardware level is shown. The circuit is preferably an application specific integrated circuit (ASIC), but other types of circuits such as field programmable gate arrays (FPGA) can also benefit from the present invention. Furthermore, the particular application for the circuit not critical.

Generally, the method 20 includes an initialization step 22 for receiving a circuit description 21 that characterizes the circuit at a behavioral level of a design hierarchy. The description is preferably in the form of a block diagram, a descriptive netlist or other suitable format. A netlist is a list of names of symbols or circuit elements and their interconnections. Netlists can be captured from a schematic of a computer aided engineering (CAE) application.

Upon receiving a new computer-based command at step 24 (from a source such as a keyboard or a script driver input), the new command is interpreted at step 28. The new command requests a desired modification in the description of the circuit. For example, the modification may replace a digital filter with a delay chain and multipliers. At step 30, an electronic file is generated based on the new command such that the electronic file characterizes the circuit at the hardware level in a desired programming language. The method 20 is an iterative method in which the electronic file is "built-up" as commands are received. The hardware level is located at a lower level in the hierarchy (typically at the bottom level) than the behavioral level.

Although the desired programming language is preferably the hardware description language (HDL), it can be appreciated that the present invention is not so limited. In the case of an ASIC, a verification mechanism is preferably provided in the form of a C language file. Simulating the operation of the circuit with the C language file provides a mechanism for cross-checking the HDL file. It is important to note, however, that the present invention provides confirmation algorithms that (depending on the confidence requirements of the application) might obviate the need for the C language file.

Turning now to FIG. 2, the presently preferred approach to the step 28 of interpreting the new command may include one or more steps. For example, when a replacement command is received at step 40, an original component (e.g., digital filter) of the circuit residing at an original level in the hierarchy is replaced at step 38 with one or more replacement components (e.g., delay chain and multipliers) residing at a lower level in the hierarchy. Step 38 also confirms that the replacement components are functionally equivalent to the original component. Detailed confirmation algorithms is discussed in greater detail below. At step 26, the hierarchical netlist is transformed (or updated) in accordance with the modifications.

An important aspect of ASIC design is the concept of architecture sharing. Architecture sharing involves the sharing of physical processing paths by symbolic (logical) processing in order to conserve resources. For example, a block diagram of a circuit at a behavioral level includes ten multipliers operating at 1 MHz. Architecture sharing permits the substitution of one multiplier operating at 10 MHz. When the architecture sharing command has been entered in step 32, an original architecture of the circuit is reduced at step 42 to provide a reduced architecture Furthermore, step 42 also confirms that the reduced architecture is functionally equivalent to the original architecture.

The process of confirming that the reduced architecture is functionally equivalent to the original architecture will now be described in greater detail. With continuing reference to FIGS. 3A and 3B, the original architecture 34 is described for an arbitrary n as follows:

$$X(n)=F[x(n)]; X(n-1)=F[x(n-1)]$$

$$Y(n)=F[y(n)]; Y(n-1)=F[y(n-1)]$$

$$Z(n)=F[z(n)]; Z(n-1)=F[z(n-1)].$$

If the reduced architecture 36 is defined as:

$$A(n) = \begin{cases} X\left(\frac{n}{3}\right) & \text{When } n \bmod 3 = 0 \\ Y\left(\frac{n-1}{3}\right) & \text{When } n \bmod 3 = 1 \\ Z\left(\frac{n-2}{3}\right) & \text{When } n \bmod 3 = 2 \end{cases}$$

Then:

$$C(n)=F[A(3n-3)]=X(n-1)$$

$$D(n)=F[A(3n-2)]=Y(n-1)$$

$$E(n)=F[A(3n-1)]=Z(n-1)$$

Thus, the original architecture 34 is equivalent to the reduced architecture 36. Specifically, it can be seen that interpolators 44 (or up converters) and decimators 46 (or down converters) permit the use of an instantaneous function F to be reduced by a factor of 3.

Returning now to FIG. 2, the present invention also provides for control logic reduction. This feature is particularly important in cases where architecture sharing results in an increase in control logic. When it is determined that a control logic reduction command has been received at step 48, redundant control logic of the circuit is eliminated and necessary control logic is modified at step 50 to produce a reduced architecture.

Figure 5A:
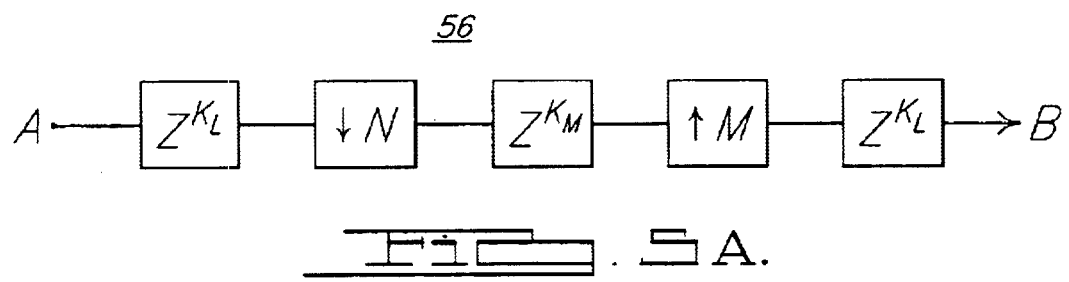
FIG. 5A is a block diagram of a single path in accordance with the principles of the present invention.
Figure 5B:
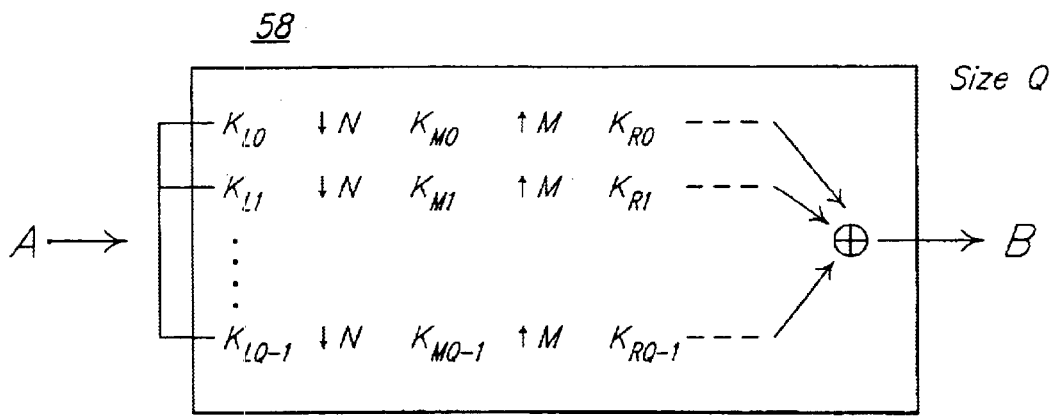
FIG. 5B is a block diagram of a set of parallel paths in accordance with principles of the present invention.

FIG. 4 illustrates the transformation of a group of logic circuits 52 into a rate change component (or reduced logic architecture) 54. It will be appreciated that the logic circuits 52 contain various rate change components such as delays, multiplexers, interpolators and decimators. It will further be appreciated that the logic circuits 52 can be defined as a set of path lists that interconnect a set of inputs to a set of outputs. FIGS. 5A and 5B demonstrate a single path 56 and a set of paths 58, respectively. The single path 56 between points A and B is therefore characterized by:

$$\boxed{K_L \downarrow N\; K_m \uparrow M\; K_R},$$

corresponding to the single path 56 of FIG. 5A.

A path list is therefore made up of a set of paths 58 from point A to point B such that each path has the same $\downarrow N$ and $\uparrow M$. It will be appreciated that in order to ensure that two outputs do not arrive concurrently, the set of paths 58 is constrained by (Kri−KRj) MOD M≠O for any i≠j. A rate change component 54 is defined as a set of path lists that interconnect the set of inputs as shown in FIG. 4.

The various multi-rate components can therefore be represented as:

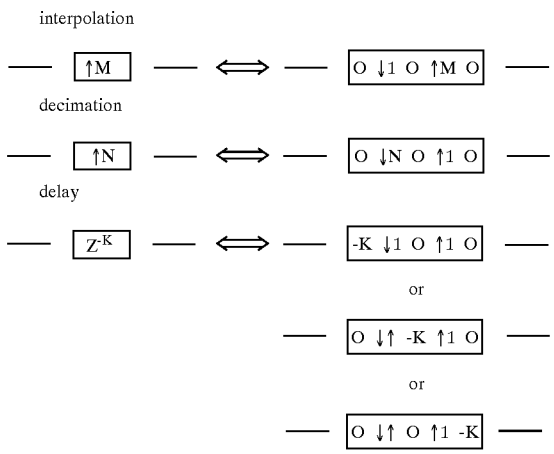

Furthermore, FIG. 6 illustrates that a 2-way counter-controlled mux 60 can be given by the counter representation 62. In order to resolve two paths in series we have:

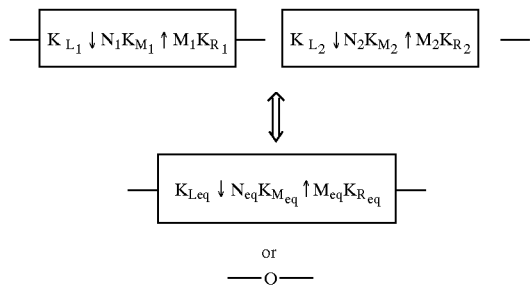

Specifically, the algorithm is given by:
Algorithm:
(1) L≙GCD ($M_1$, $N_2$)
(2) If ($K_{R1}+K_{L2}$)MOD L≠O
Delete path
Go to "DONE"

(3) $\overline{M}_1 = \dfrac{M_1}{L};\quad \overline{N}_2 = \dfrac{N_2}{L};$ (4) Use Euclid's algorithm to find $P_1$, $P_2$, such that:

$P_1\overline{M}_1 + P_2\overline{N}_2 = 1$ (5) Define the equivalent values for the new path:

$K_{Leq} = K_{L1} + N_1 K_{M_1} + \dfrac{K_{R1}+K_{L2}}{L} P_1 N_1$ $K_{Req} = K_{R2} + M_2 K_{M_2} + \dfrac{K_{R1}+K_{L2}}{L} P_2 M_2$ $K_{Meq} = 0$ $N_{eq} = N_1 \overline{N}_2$ $M_{eq} = \overline{M}_1 M_2$ (6) "DONE"

Returning now to FIG. 2, the present invention further determines whether an implementation assignment command has been received at step 64. Step 66 replaces an original component of the circuit with one or more implementation components based on the implementation assignment command. Specifically, FIGS. 7A and 7B illustrate that an original component 68 (although not necessarily a component of the behavioral description) has one or more implementation components 70 that are equivalent to the original component 68. The implementation components 70 are contained within the library of foundry primitives and have unambiguous HDL descriptions that are associated with them. Typically, the implementation components are adders and multipliers. For example, if implementation component 70a is a multiplier that multiplies two 5-bit numbers and produces a 10-bit result, this component can be readily represented in HDL.

Returning now to FIG. 2, the present invention determines whether a delay shifting command has been received at step 72. Step 74 moves a delay component from a first location in the circuit to a second location in the circuit based on the delay shifting command. Specifically, FIG. 8 illustrates the rearrangement of an origional architecture 76 by moving a delay component 78 from a first location in a circuit to a second location. The resulting architecture 80 has a total delay that is maintained.

the heirarchical netlist has a unique file structure that is represented in several equivalent forms throughout the transformation process. An element in the netlist is represented by a N-tuple, defining:

TABLE 1

| Tuple # | Parameter |
| --- | --- |
| 1 | element type |
| 2 | input ports |
| 3 | - from |
| 4 | output ports |
| 5 | - to |
| 6 | level in hierarchy |
| N | context dependent flags |

The design tool architecture therefore accepts inputs at the behavioral level and automatically generates both compilable code at the HDL level and C-code for efficient system simulation. When the tool architecture is script driven, automatic transformation of the behavioral description (either block diagram or netlist) into a structural HDL form is possible. In the structural HDL form, realizable foundry library components (such as adders and multipliers) are substituted for idealized components and architecture sharing and bit precision are defined. The automated code generation and associated file structure produced by the design tool architecture allow the design time from system concept to delivery of compiled code for the resulting ASIC to be reduced by as much as a factor of 10.

The file structure allows for efficient 2-way travel through the hierarchical netlist when executing the transformations. Furthermore, the tool architecture allows for a systematic hierarchical proof of equivalence at every transformation, rather than requiring a much more complex (and often impossible) proof of overall equivalence at the completion of compilation. The command sets (i.e., transformations) are preferably script driven and are intended to be reusable to efficiently optimize a given problem architecture as well as to solve similar functional problems.

The design tool according to the invention also constructs both numeric C-code and numeric HDL-code from a basic behavioral input block diagram. In parallel, the design tool also constructs symbolic C-code and HDL-code. The design tool allows a designer to prove that all of the numeric and symbolic codes are functionally equivalent.

The design tool accepts inputs that the behavioral level and automatically generates both compilable code at HDL level and C-code for efficient system simulation. The HDL code and C-code representations are proven to be functionally equivalent through the use of the corresponding symbolic HDL code and symbolic C-codes. The set of numeric and symbolic codes generated from a common behavioral block diagram allow the design time from system concept to provably correct compilable code for the ASIC to be reduced significantly—perhaps by as much as a factor of 10.

In prior design tools, functional block diagrams are initially conceived at the behavioral level. The designers perform a time-consuming set of manual revisions to the functional block diagrams as was previously described above. Eventually, the designers produce an Algorithm Book that is suitable as a template for coding HDL. The designers develop the HDL code for subsequent ASIC fabrication. A second design 10 produces bit compatible C-code for system simulation and validation.

In contrast, the design tool according to the present invention automatically generates the code sets from the behavioral level description. The design tool automatically establishes the hierarchy of the code structure, the physical sharing the gates, the substitution and instantiation of foundry cells, and the generation of the required control object.

Figure 9:
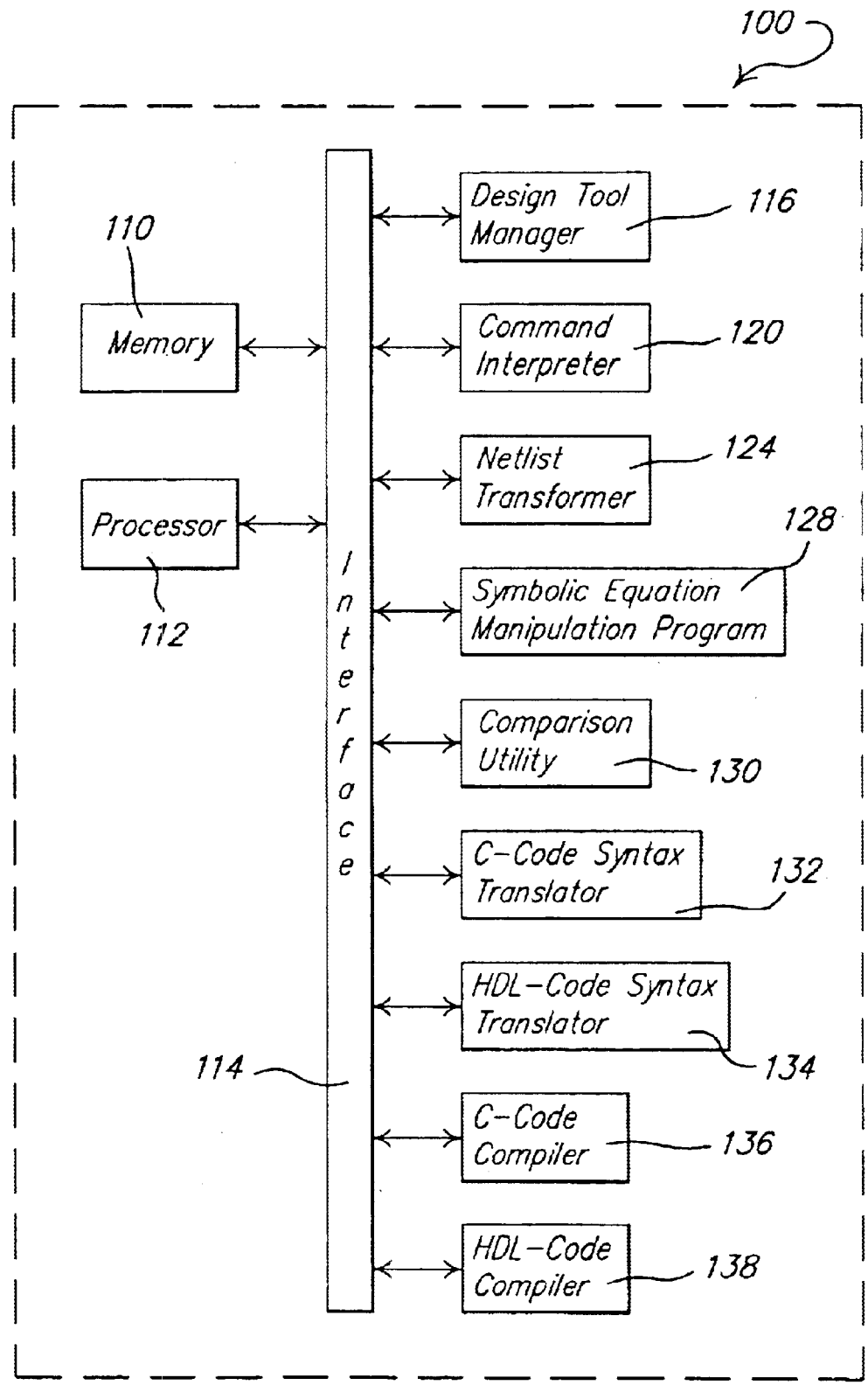
FIG. 9 is a functional block diagram illustrating a design tool according to the present invention.

Referring now to FIG. 9, a functional block diagram of the design tool 100 is illustrated. The design tool 100 is preferably implemented on a computer or workstation. The design tool 100 includes memory 110 such as read only memory (ROM), random access memory (RAM), or other suitable electronic memory and a processor 112. The memory 110 and the processor 112 are connected to an input/output interface 114. A design tool manager 116 handles administrative and managerial tasks that are associated with the design of ASIC modules or systems as will be described further below. The design tool 100 further includes a command interpreter 120 and a netlist transformer 124 that transforms the behavioral level description into a netlist and a set of reference equations. A symbolic equation manipulation program 128 operates in a conventional manner. A comparison utility 130 compares equation files and identifies unexpected differences. C-code and HDL-code syntax translators 132 and 134 translate the reference equations into symbolic and numeric C-code and HDL-code. The C-code and HDL-code compilers 136 and 138 compile and simulate the symbolic C-code and HDL-code and generate C-code and HDL-code equation files.

Figure 10:
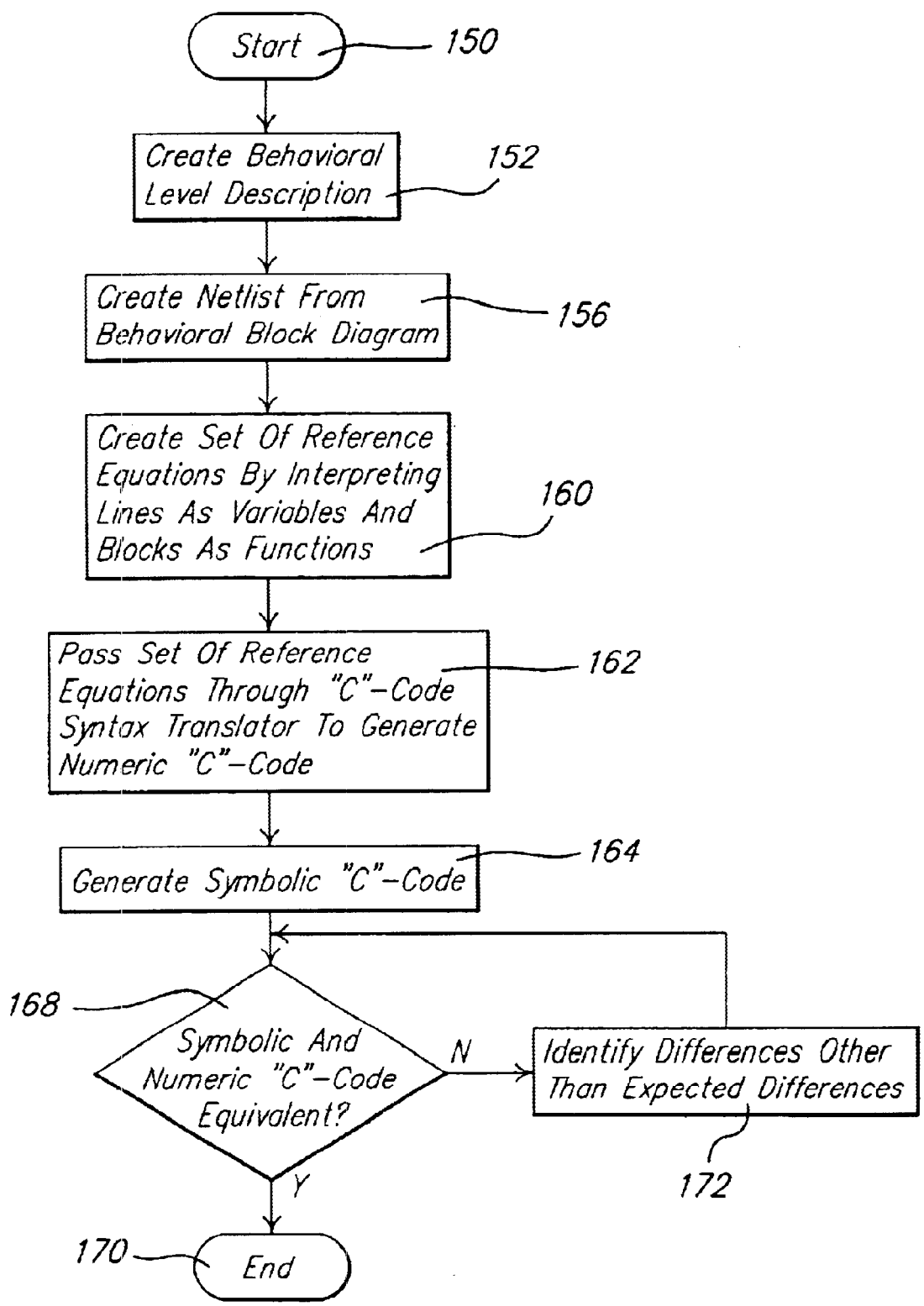
FIG. 10 illustrates steps for generating symbolic and numeric C-code.

Referring now to FIG. 10, steps for designing the ASIC module or system are shown. Control begins with step 150. In step 152, the designer creates a behavioral level description that satisfies the requirements for the circuit. In step 156, a netlist representation is created from the behavioral level description. The behavioral level description or block diagram may be treated graphically and manually, machine transformed to the netlist representation using netlist transformer 124, or initially created as a netlist. In step 160, reference equations are created by interpreting lines connecting blocks as variables and blocks as functions. In step 162, the C-code syntax translator 132 uses parallel structures and string-to-algebraic substitutions to produce numeric C-code. In other words, the reference equations are passed through the C-code syntax translator 132 to generate the numeric C-code. In step 164, symbolic C-code is also generated by the C-code syntax translator 132. In step 168, the symbolic C-code and numeric C-code is compared by the comparison utility. If they are equivalent, then the C-code generation and validation steps end at step 170. Otherwise, differences (other than expected differences) are identified and corrected in step 172.

Referring now to FIG. 11, steps for generating and validating HDL code are shown and are generally designated 180. Control begins at step 182. In step 184, the reference equations are passed through the HDL-code syntax translator 134 to produce numeric HDL-code. In step 186, the symbolic HDL-code is generated. The HDL-code syntax translator 134 uses parallel structures and string-to-algebraic substitutions to generate the numeric and symbolic HDL-code. In step 188, symbolic and numeric C-code is compared by the comparison utility 130. If they are equivalent, control of the HDL-code generation and validation steps end at step 192. Otherwise, differences (other than expected differences) are identified at step 194, analyzed and corrections are made.

Referring now to FIG. 12, steps for validating the HDL-code and the C-code are shown and are generally identified at 200. The comparison utility 130 and the symbolic manipulation program 128 are used to establish equivalence among the file sets that include the numeric and symbolic C-code and HDL-code. Control begins at step 204. In step 206, the symbolic C-code is compiled and simulated and the equation file is printed or stored in a C-code electronic file. In step 210, the symbolic HDL-code is compiled and simulated and the equation file is printed or stored in a HDL-code electronic file. In step 212, a symbolic manipulation program solves for a difference between the symbolic C-code and the symbolic HDL-code equation files. If the files are equivalent as determined in step 214, then the final code is declared to be the equivalent of the behavioral level description or block diagram in step 216 and control ends. Otherwise the differences are identified and corrections are made in step 218. In a preferred embodiment, the HDL could be either Verilog or VHDL.

At any level of hierarchy, the behavioral or system level block diagram and associated netlist may be interpreted as signal flow graphs. Lines between the box in the behavioral or system level block diagram are variables. The box in any behavioral or system level block diagram are functions that operate on the variables that enter the box to produce the variables that exit the box. Scanning through the behavioral or system level block diagram (in other words parsing the netlist) from input to output produces a set of equations that describe the functions at the behavioral or system level block diagram. The design tool parses the netlist at any desired level of hierarchy and creates the equation file set described above in conjunction with FIGS. 9–12.

From a single common netlist, a set of reference equations is generated. Passing these equations through a "C" syntax translator produces executable C-code that is suitable for efficient system level simulation and performance verification. Simultaneously, the set of reference equations is passed through a HDL syntax translator to produce executable HDL code that is suitable for compilation to gates and subsequent ASIC fabrication. In addition, the symbolic C-code is symbol-for-symbol identical to the numeric C-code except that each numeric variable is replaced by a string variable having the same name and the numeric operators are replaced by the equivalent string symbols. When the files are compared symbol-by-symbol, for example using the UNIX utility difference, they are identical with the exception of the systematic differences that occur between numeric and string variables and between numeric and string representations of the operators. Peri scripts are used to rigorously scan the difference list to confirm that every difference is expected. This step guarantees that the symbolic C-code file is functionally equivalent to the numeric C-code file. A similar sequence is performed to generate and certify that the symbolic HDL-code file is functional equivalent to be comparable numeric HDL-code file.

The symbolic files are then compiled and simulated. The symbolic files print (or store in an electronic file) a list of symbolic equation files. The symbolic equation files are then used as an input to commercially available symbolic equation manipulation programs, such as Mathematica, which treats the files as sets of equations. In general, the symbolic equation manipulation program is used to simplify the sets of equations to a minimum form. In particular, the symbolic equation manipulation program is used to resolve the difference between the equations in the symbolic C-code and in the symbolic HDL-code files. If the difference between the symbolic equation sets is zero, then the equation sets are functionally equal.

In the design tool according to the present invention, the file sets establish the functional equivalence between the C-code and the HDL-code sets. The design tool also establishes the equivalence between the final compilable code and the original behavioral level description or block diagram. A functional description for the block diagram is typically obtained from a textbook either in closed form or as an algorithm.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A method for characterizing a circuit at a hardware level, comprising the steps of:
    creating a behavioral level description of said circuit;
    creating a netlist from said behavioral level description;
    creating reference equations from said netlist;
    translating said reference equations into numeric C-code;
    translating said reference equations into symbolic C-code;
    comparing said symbolic C-code to said numeric C-code to validate said symbolic C-code; and
    translating said reference equations into numeric HDL-code.

2. The method of claim 1 further comprising the step of translating said reference equations into symbolic HDL-code.

3. The method of claim 2 further comprising the step of comparing said symbolic HDL-code to said numeric HDL-code to validate said symbolic HDL-code.

4. The method of claim 3 further comprising the steps of:
    compiling and simulating said symbolic C-code; and
    generating a C-code equation file.

5. The method of claim 4 further comprising the steps of:
    compiling and simulating said symbolic HDL-code; and
    generating a HDL-code equation file.

6. The method of claim 5 further comprising the step of using a symbolic manipulation program to solve for a difference between said C-code equation file and said HDL-code equation file.

7. The method of claim 6 further comprising the step of declaring said compiled C-code equation file and said HDL-code equation file equivalent to said behavioral level description if said difference is equal to zero.

8. The method of claim 7 wherein said symbolic and numeric HDL-code is symbolic and numeric VHDL-code.

9. A method for characterizing a circuit at a hardware level, comprising the steps of:
    creating a behavioral level description of said circuit;
    creating a netlist from said behavioral level description;
    creating reference equations from said netlist;
    translating said reference equations into numeric C-code;
    translating said reference equations into symbolic C-code;
    comparing said symbolic C-code to said numeric C-code to validate said symbolic C-code;
    translating said reference equations into numeric HDL-code;
    translating said reference equations into symbolic HDL-code; and
    comparing said symbolic HDL-code to said numeric HDL-code to validate said symbolic HDL-code.

10. The method of claim 9 further comprising the steps of:
    compiling and simulating said symbolic C-code; and
    generating a C-code equation file.

11. The method of claim 10 further comprising the steps of:
    compiling and simulating said symbolic HDL-code; and
    generating a HDL-code equation file.

12. The method of claim 11 further comprising the step of using a symbolic manipulation program to solve for a difference between said C-code equation file and said HDL-code equation file.

13. The method of claim 12 further comprising the step of declaring said compiled C-code equation file and said HOL-code equation file equivalent to said behavioral level description if said difference is equal to zero.

14. The method of claim 13 wherein said symbolic and numeric HDL-code is symbolic and numeric VHDL-code.

15. A design system for characterizing a circuit at a hardware level, comprising:
    a netlist transformer for creating a netlist and reference equations from a behavioral level description;
    a C-code syntax translator for translating said reference equations into numeric and symbolic C-code;
    a HDL-code syntax translator for translating said reference equations into numeric and symbolic HDL-code; and
    a comparing utility that compares said symbolic C-code to said numeric C-code to validate said symbolic C-code.

16. The design system of claim 15 wherein said comparing utility compares said symbolic HDL-code to said numeric HDL-code to validate said symbolic HDL-code.

17. The design system of claim 16 further comprising a C-code compiler that compiles and simulates said symbolic C-code and that generates a C-code equation file.

18. The design system of claim 17 further comprising a HDL compiler that compiles and simulates said symbolic HDL-code and that generate a HDL-code equation file.

19. The design system of claim 18 further comprising a symbolic manipulation program that solves for a difference between said C-code equation file and said HDL-code equation file.

20. The design system of claim 19 wherein said symbolic and numeric HDL-code is symbolic and numeric VHDL-code.

21. A design system for characterizing a circuit at a hardware level, comprising:

a netlist transformer for creating a netlist and reference equations from a behavioral level description;

a C-code syntax translator for translating said reference equations into numeric and symbolic C-code;

a HDL-code syntax translator for translating said reference equations into numeric and symbolic HDL-code; and a comparing utility that compares said symbolic HDL-code to said numeric HDL-code to validate said symbolic HDL-code.

* * * * *